United States Patent [19]

Watanabe et al.

[11] Patent Number: 4,833,341

[45] Date of Patent: May 23, 1989

[54] SEMICONDUCTOR DEVICE WITH POWER SUPPLY VOLTAGE CONVERTER CIRCUIT

[75] Inventors: Yohji Watanabe, Kawasaki; Tohru Furuyama, Tokyo, both of Japan

[73] Assignee: Kabushiki Kaisha Toshiba, Kawasaki, Japan

[21] Appl. No.: 31,263

[22] Filed: Mar. 30, 1987

[30] Foreign Application Priority Data

Apr. 1, 1986 [JP] Japan .................... 61-74980

[51] Int. Cl.$^4$ .............................................. G05F 3/16
[52] U.S. Cl. ................................ 307/296.1; 307/491;
307/360; 323/311
[58] Field of Search ................ 307/296.4, 296.5, 491,
307/468, 496, 360, 584, 517, 296 R, 297;
323/313, 311; 365/226

[56] References Cited

U.S. PATENT DOCUMENTS 3,639,779 2/1972 Garrigus ........................... 307/261
4,691,123 9/1987 Hashimoto ......................... 307/491

OTHER PUBLICATIONS

K. Itoh et al.: "An Experimental 1Mb Dram with On–Chip Voltage Limiter", ISSCC Dig. Tech. Papers, p. 282 (1984).

Primary Examiner—Stanley D. Miller
Assistant Examiner—Timothy P. Callahan
Attorney, Agent, or Firm—Oblon, Fisher, Spivak, McClelland & Maier

[57] ABSTRACT

An integrated semiconductor device is disclosed which has a highly-integrated circuit formed on a substrate. A constant voltage generator is connected to the integrated circuit, for receiving an externally-supplied d.c. power supply voltage to produce a regulated d.c. voltage, the potential level of which is lower than the external power supply voltage and remains substantially constant irrespective of the external power supply voltage. A mode-change controller is connected in parallel with the voltage generator, for supplying the output d.c. voltage of the voltage generator to the integrated circuit as an internal power supply voltage in a normal operation mode. When the device is subjected to an accelerated test using an increased power supply voltage, a switching transistor is rendered conductive under the control of a control circuit, thereby allowing the external power supply voltage to be directly applied to the integrated circuit.

8 Claims, 3 Drawing Sheets

SEMICONDUCTOR DEVICE WITH POWER SUPPLY VOLTAGE CONVERTER CIRCUIT

BACKGROUND OF THE INVENTION

The present invention relates to semiconductor devices and, more particularly, to a semiconductor integrated circuit device of a high packing density having a power supply voltage converting circuit for generating a bias voltage suitably supplied to microfabricated transistors fabricated on the submicron order.

In the field of semiconductor integrated circuit devices integrating transistors such as MOSFETs, the packing density has been increasing year by year. For example, in semiconductor memories, the development of a 4- or 16-Mbit dynamic random access memory (referred to as a "dRAM" hereinafter) is in progress. In such memory s having a very high packing density, them minimum fabrication size of transistors used in memory cells, dummy cells, peripheral drivers (including a sense amplifier), etc. is reduced to less than one micron (i.e., the submicron order). In this case, a large number of transistors (generally several millions of transistors) are formed according to the most advanced micro-patterning techniques.

In a micro-fabricated dRAM, channel lengths of MOSFETs constituting its internal circuits are decreased. In this case, when a d.c. power supply voltage of normal level (e.g., 5 volts) is applied to the dRAM, basic characteristics such as operational reliability of each MOSFET and the dielectric strength of the source-drain path thereof are undesirably degraded. This is because an electric field in each micro-fabricated FET on the submicron order is too strong. More specifically, when the channel length of the transistors is decreased, the internal electric field generated in the transistor is increased upon application of a voltage to the source-drain path. As a result, when a normal MOS structure is simply micronized, the dielectric breakdown strength in the source-drain path is abruptly decreased, thereby degrading the operational reliability of the semiconductor memory.

In a conventional memory, in order to solve the above problem, a voltage converting circuit is arranged in a highly-integrated IC device to supply a low and constant power supply voltage to transistors microfabricated on the submicron order and constituting its internal circuits. The voltage converting circuit includes a constant voltage circuit for receiving external power supply voltage Vcc (e.g., 5 volts) of the existing standards (the external power supply voltage is set according to the conventional manner so as to establish versatility) and for generating a d.c. voltage Va (e.g., 3 to 4 volts) reduced as an internal power supply voltage. In the conventional voltage converting circuit, when an externally-supplied d.c. voltage is increased and the power supply voltage for internal circuits (i.e., internal power supply voltage) reaches predetermined potential Va, an output voltage of the voltage converting circuit is fixed. Even if the reference d.c. voltage is further increased, the output voltage of the voltage converting circuit is constantly maintained at voltage level Va. Therefore, a proper, low power supply voltage can be stably supplied to the IC internal circuits.

According to ICs incorporating such power supply voltage converting circuits, however, an accelerated test for testing operational reliability of IC cannot be effectively performed due to the following reason. In such a test, a power supply voltage higher than the normal voltage level must be forcibly applied to the internal circuits. In other words, in order to confirm long-term operational reliability of ICs in a short period of time, a d.c. voltage higher than the normal power supply voltage Vcc by a few volts must be applied to the ICs, and normal operation under such severe conditions must be confirmed. In this case, since the circuit for generating the constant voltage is incorporated in each IC, a prescribed low d.c. voltage is automatically supplied to the internal circuits by the behavior of the power supply voltage converting circuit even if the high voltage for the accelerated test is applied thereto. As a result, such a high voltage cannot be directly applied to the internal circuits, and the accelerated test cannot be performed.

In order to overcome this problem, the characteristics of the constant voltage generator may be modified as follows. Second reference level Vb higher than the reference level by a few volts is set. When the external d.c. power supply voltage applied to the ICs exceeds the second reference voltage, the generator generates a voltage proportional to the external voltage. In other words, constant voltage generation action is limited within the range between first and second reference voltages Va and Vb (Va<Vb). When the external d.c. power supply voltage applied to the ICs is lower than the first reference voltage or higher than the second reference voltage, the voltage changing in proportion to the magnitude of the external power supply voltage is supplied to the internal IC. Therefore, if the accelerated-test voltage is set to be high enough to exceed the second reference level, the accelerated test can be performed. In the normal operation, if the voltage applied to the internal IC is set within the range between voltages Va and Vb, constant voltage generation action in the normal operation mode can be assured. With this arrangement, however, the margin for stably supplying the power supply voltage to the internal IC is undesirably narrowed, which entails another decisive drawback.

SUMMARY OF THE INVENTION

It is therefore an object of the present invention to provide a new and improved very large integrated circuit semiconductor device which can appropriately supply a low d.c. voltage to internal circuits with a wide margin regardless of variations in an externally-supplied power supply voltage and which allows an effective accelerated test.

In accordance with the above object, the present invention is addressed to a specific semiconductor integrated circuit device which has internal circuits formed on a semiconductor substrate. The internal circuits are constituted by micro-fabricated transistors. The semiconductor device includes a constant voltage generator serving as a power supply voltage converting circuit. The generator receives an externally-supplied d.c. power supply voltage in the normal operation mode of the semiconductor device and generates an internal power supply voltage lower than that. The internal power supply voltage is maintained substantially constant regardless of the magnitude of the externally-supplied voltage and is supplied to the internal circuits of the semiconductor device. An automatic switching circuit is arranged on the substrate and is connected in parallel with the constant voltage generator. When an accelerated test is performed to examine operational reliability of the semiconductor device, the switching circuit automatically switches a voltage application path for the internal circuits, thereby allowing direct application of the external power supply voltage having a higher level than the normal voltage level to the internal circuits.

The invention, and its objects and advantages will be more apparent in the detailed description of a preferred embodiment presented below.

BRIEF DESCRIPTION OF THE DRAWINGS

In the detailed description of a preferred embodiment of the invention presented below, reference is made to the accompanying drawings of which.

DETAILED DESCRIPTION OF PREFERRED EMBODIMENT

Figure 1:
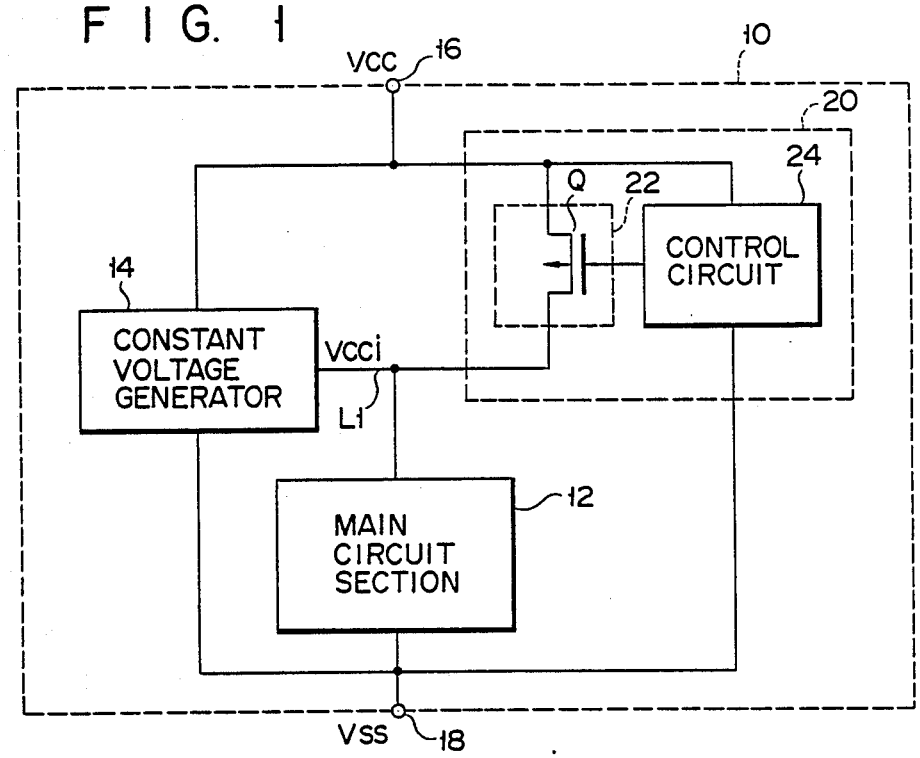
FIG. 1 is a block diagram showing a circuit configuration of a semiconductor integrated circuit device including a constant voltage generator and a mode-change controller in accordance with one preferred embodiment of the present invention.

Referring now to FIG. 1, a square block drawn by dotted line "10" designates a silicon chip substrate of a semiconductor integrated circuit (IC) device in accordance with one preferred embodiment of the present invention. Internal main circuit section 12 is comprised of highly-integrated transistors, such as metal oxide semiconductor field effect transistors (referred to as "MOSFETs" hereinafter). These MOSFETs are formed on substrate 10 using advanced micro-fabrication techniques to decrease channel length on the order of a submicron. If the device is a logic LSI, circuit section 12 may include a logic array forming an arithmetic logic unit. If the device is a memory, circuit section 12 may include a memory cell matrix, a driver circuit, and the like.

Constant voltage generator 14 is provided on substrate 10 and in connected to power supply voltage terminal 16, ground terminal 18, and main circuit section 12. Voltage generator 14 serves as a d.c. power supply voltage converter. The semiconductor device is biased with d.c. power supply voltage Vcc, which is externally applied through terminal 16. Voltage generator 14 receives external power supply voltage Vcc to produce regulated d.c. voltage Vcci, which is lower than external power supply voltage Vcc, thereby improving the operational reliability of micro-fabricated MOSFETs constituting main circuit 12. For example, when power supply voltage Vcc is 5 volts, internal power supply voltage Vcci is 3 volts. The output level of voltage generator 14 is stabilized to remain at reference level Vr, irrespective of change in external power supply voltage Vcc. Output voltage Vr of voltage generator 14 is supplied, as internal power supply voltage Vcci, to main circuit section 12 through internal power supply line L1.

Automatic switching circuit 20 is connected in parallel with voltage generator 14, for serving as a mode-change controller which changes the voltage supply path for main circuit section 12, in accordance with changes in the operation modes, of the semiconductor device More specifically, the mode-change controller includes switching element 22 and control circuit 24. Switching element 22 may be p-channel type MOSFET Q which is the same kind of transistor as used in main circuit 12. MOSFET Q is connected between power supply terminal 16 and internal power supply line Ll. Control circuit 24 detects whether the semiconductor device is in a normal operation mode or an accelerated test mode. When it is detected that the device operates in the normal operation mode, control circuit 24 controls MOSFET Q such that it becomes nonconductive. Under such conditions since power supply terminal 16 is connected to main circuit section 12 via voltage generator 14, constant output voltage Vr of voltage generator 14 is supplied to main circuit section 12. On the other hand, when it is detected that the device operates in the accelerated test mode, control circuit 24 then makes MOSFET Q conductive in order to bypass voltage generator 14. Under this condition, power supply terminal 16 is directly connected to main circuit section 12, so that external power supply voltage Vcc is directly supplied to main circuit section 12.

The mode change operation of tee semiconductor device by means of mode-change controller 20 will be described in detail with reference to the graph (FIG. 2) showing the relationship between external power supply voltage Vcc supplied to the semiconductor device and internal power supply voltage Vcci therein. Switching transistor Q of mode-change controller 20 is rendered nonconductive by control circuit 24. Under this initial condition of controller 20, an output voltage of constant voltage generator 14 is applied to main circuit section 12.

Figure 2:
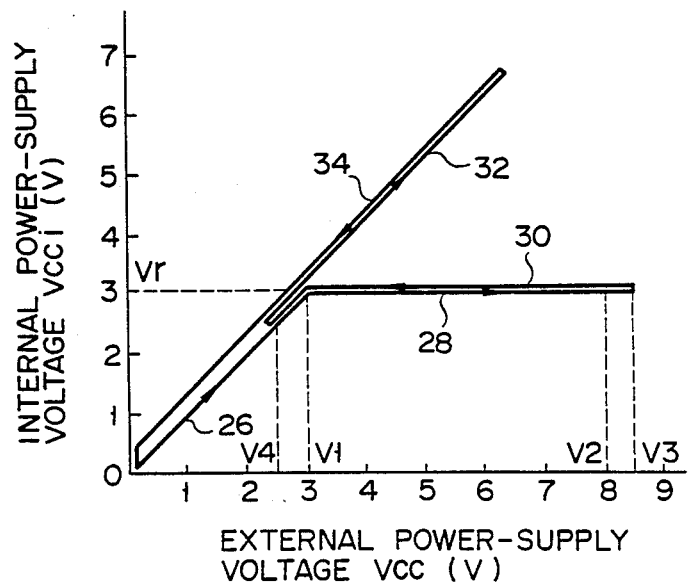
FIG. 2 is a graph illustrating the variation of an internal power supply voltage for a main circuit section of the semiconductor device with an externally-supplied power supply voltage in a normal operation mode and an accelerated test mode.

In the normal operation mode of the semiconductor device, when external power supply voltage Vcc is gradually increased from zero volts, output voltage Vcci of voltage generator 14 is linearly increased in proportion to voltage Vcc, as indicated by arrow 26 in FIG. 2. When voltage Vcc is increased and reaches potential level V1 (=3 volts), voltage Vcci of generator 14 is fixed at reference level Vr (=3 volts). Even if voltage Vcc is increased over level V1, voltage Vcci of generator 14 is maintained at reference level Vr, as indicated by arrow 28. The characteristic graph in FIG. 2 demonstrates that output voltage Vcci of voltage generator 14 is maintained at reference level Vr even if external power supply voltage Vcc continues to increase up to potential level V2 (=8 volts). Therefore, in the normal operation mode, when external power supply voltage Vcc of 5 volts is applied to the semiconductor device, voltage Vcci having level Vr of 3 volts is supplied from constant voltage generator 14 to main circuit section 12.

In the accelerated test mode of the semiconductor device, external power supply voltage Vcc is set at voltage level V3 (e.g., 8.5 volts) higher than voltage level V2 and is then decreased and set at voltage level V4 (e.g., 2.5 volts) slightly lower than voltage level V1. Such changes in external power supply voltage Vcc are detected by control circuit 24 connected to power supply terminal 16. In this case, MOSFET Q is rendered conductive under the control of control circuit 24. The input and output terminals of constant voltage generator 14 are bypassed, and power supply terminal 16 is directly connected to main circuit section 12. In the accelerated test mode, MOSFET Q is kept conductive. When external power supply voltage Vcc is increased over potential level V1 again, main circuit section 12 is applied with external power supply voltage Vcc exceeding reference voltage level Vr. In other words, voltage Vcci applied to the semiconductor device is linearly increased to a high voltage level required for the accelerated test, as indicated by arrow 32, thereby effectively performing the accelerated test of the semiconductor device.

When the accelerated test mode of the semiconductor device is completed, external power supply voltage Vcc is decreased to zero volts, as indicated by arrow 34 in FIG. 2. When the change in voltage Vcc is detected by control circuit 24, control circuit 24 renders MOSFET Q nonconductive. Therefore, mode-change controller 20 is initialized to set the semiconductor device in the normal operation mode. When voltage Vcc is set at the normal level, i.e., 5 volts, the output voltage of generator 14 having reference voltage level Vr is stably supplied as internal power supply voltage Vcci to main circuit section 12 in the same manner as described above.

A description will now be given of the detailed circuit configuration of control circuit 24 of mode-change controller 20 with reference to FIG. 3. Control circuit 24 includes two voltage generators 40 and 42 which constantly produce d.c. voltages of fixed potential levels. The output of one d.c. voltage generator 40 is connected to a non-inverting input of differential amplifier 44. The output of tee other d.c. voltage generator 42 is connected to an inverting input of differential amplifier 46. Differential amplifiers 44 and 46 serve as voltage comparators. An inverting input of differential amplifier 44 is connected in common with a non-inverting input of differential amplifier 46 by a line L2, which is connected to node 48 of a series circuit of resistors R1 and R2, which functions to produce a reference voltage for voltage comparators 44 and 46. External power supply voltage Vcc is applied to one terminal 50 of series resistors R1 and R2. The other terminal 52 is grounded.

Outputs of differential amplifiers 44 and 46 are connected to flip-flop circuits 54 and 56, respectively. Each of flip-flop circuits 54 and 56 is comprised of two NAND gates 58 and 60, or 62 and 64. In flip-flop circuit 54, NAND gate 58 has a first input connected to the output of comparator 44, a second input connected to an output of NAND gate 60, and an output connected to a first input of NAND gate 60, which has a second input connected to node 66 of a series circuit of resistors R3 and R4. These resistors are series-connected between terminals 68 and 70. External power supply voltage Vcc is applied to one terminal 68, while the other terminal 70 is grounded. Capacitor C is connected in parallel with resistor R4. Resistors R3 and R4 and capacitor C constitute a circuit for initializing flip-flop circuit 54. In the other flip-flop circuit 56, NAND gate 62 has a first input connected to the output of NAND gate 58, a second input connected to an output of NAND gate 64 and an output connected to a first input of NAND gate 64 and a gate electrode of switching MOSFET Q. NAND gate 64 has a second input connected to the output of voltage comparator 46.

Figure 3:
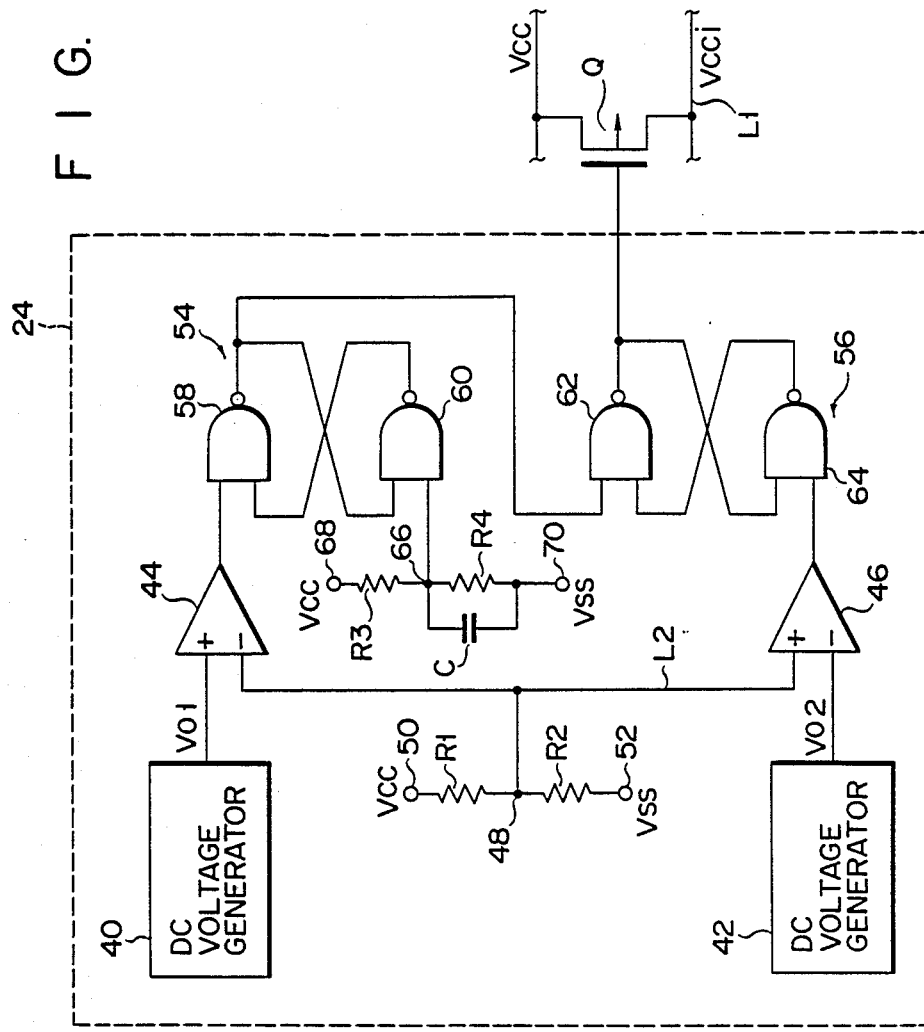
FIG. 3 is a diagram showing the detailed circuit configuration of the mode-change controller in the semiconductor device of FIG. 1.
Figure 4:
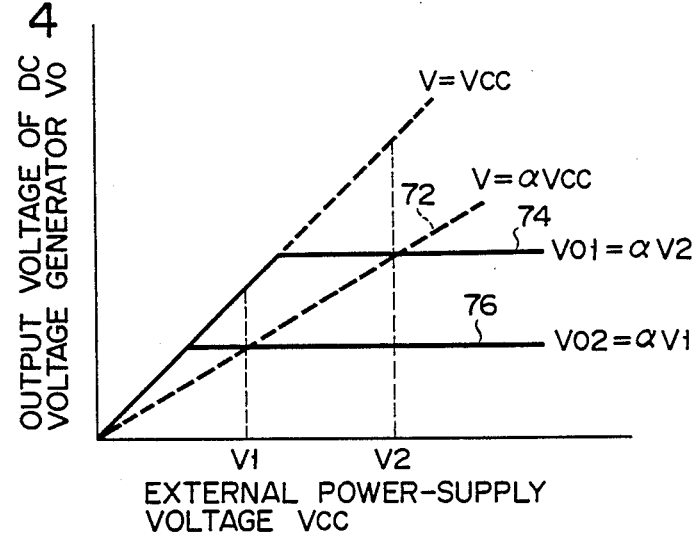
FIG. 4 is a graph showing the relationship between the external power supply voltage and the output voltage levels o two d.c. voltage generators, which are provided in a control circuit of the mode-change controller.

FIG. 4 is a graph showing output voltage characteristics of d.c. voltage generators 40 and 42 arranged in control circuit 24 shown in FIG. 3. When the external power supply voltage Vcc applied to terminal 50 is increased, a potential at series resistors R1 and R2 in FIG. 3 is linearly increased according to $V = \alpha Vcc$ (where $\alpha < 1$), as indicated by broken line 72 in FIG. 4. Output voltage Vol of voltage generator 40 is kept at a constant potential, i.e., $\alpha V2$ (wherein V2 is a higher reference voltage in the graph of FIG. 2). Output voltage Vo2 of voltage generator 42 is kept at a constant potential, $\alpha V1$ (wherein V1 is a lower reference voltage in the graph of FIG. 2).

Figure 5A:
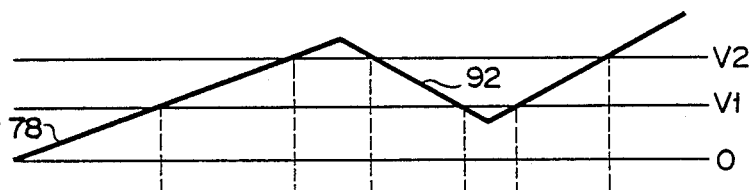
FIGS. 5A to 5H are diagrams showing waveforms of main electrical signals produced at the main portions of the mode-change controller shown in FIG. 3.
Figure 5B:
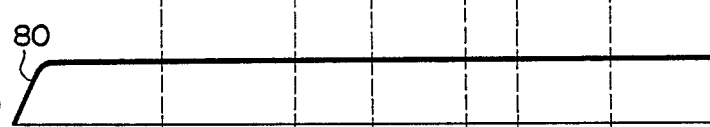
Figure 5C:
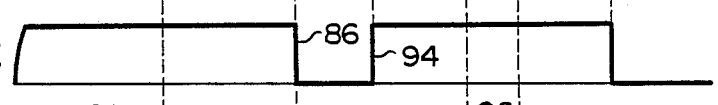

The operation mode of control circuit 24 will be described in detail with reference to FIG. 4 and the waveforms of the signals shown in FIGS. 5A to 5H. When external power supply voltage Vcc applied to the semiconductor device is gradually increased from zero, as indicated by solid line 78 in FIG. 5A and reaches potential V1 in a predetermined period of time, this predetermined period of time corresponds to that in which the potential at node 48 between series resistors R1 and R2 is lower than both output voltages Vol and Vo2 of d.c. voltage generators 40 and 42. During this period, comparator 44 generates an output signal of logic "high" level (see FIG. 5C). Comparator 46 generates an output signal of logic "low" level (see FIG. 5D). Series resistors R3 and R4 in the initialization circuit in flip-flop circuit 54 are kept at zero volts upon initial application of external power supply voltage Vcc, as shown in FIG. 5B. The output potential of NAND gate 60 has logic "high" level, as shown in FIG. 5F. The output potential of NAND gate 58 has logic "low" level, as shown in FIG. 5E. In this case, the output potential of NAND gate 64 in flip-flop circuit 56 has logic "high" level, as shown in FIG. 5G. An output potential of NAND gate 62, i.e., an output potential of flip-flop circuit 56 (this potential is applied to the gate electrode of switching MOSFET Q) is kept at logic "high" level (see FIG. 5H). In this condition, p-channel MOSFET Q is rendered nonconductive.

Figure 5D:
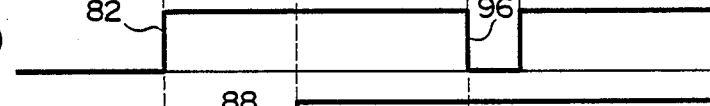
Figure 5E:
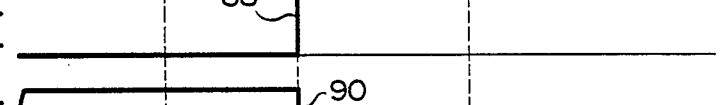
Figure 5F:
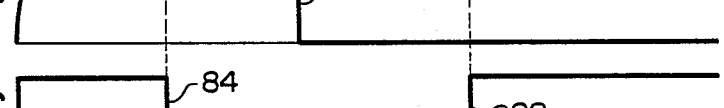
Figure 5G:
Figure 5H:

When external power supply voltage Vcc exceeds potential level V1, an output voltage of comparator 46 is inverted from logic "low" level to logic "high" level, as indicated by line 82 (FIG. 5D). In response to this, an output voltage of NAND gate 64 is inverted from logic "high" level to logic "low" level, as indicated by line 84 in FIG. 5G. In this case, the output voltage of flip-flop circuit 56 is still kept at logic "high" level.

When external power supply voltage Vcc is further increased and exceeds potential level V2, an output voltage of comparator 44 is inverted from logic "high" level to logic "low" level, as indicated by line 86 in FIG. 5C. In response to this, an output voltage of NAND gate 58 is inverted from logic "low" level to logic "high" level, as indicated by line 88 in FIG. 5E. An output voltage of NAND gate 60 is inverted to logic "low" level, as indicated by line 90 of FIG. 5F. In this case, the output voltage of flip-flop circuit 56 is still kept at logic "high" level. Under this condition, the output voltage of the other flip-flop circuit 56 is kept at logic "high" level since the output voltage of NAND gate 64 is kept at logic "low" level, as shown in FIG. 5G.

When external power supply voltage Vcc is increased from potential level V2 and is then decreased below level V2, as indicated by line 92 in FIG. 5A (this potential change corresponds to that indicated by line 30 in FIG. 2), an output voltage of comparator 44 is inverted again to logic "high" level, as indicated by line 94 in FIG. 5C. When external power supply voltage Vcc is further decreased below potential level V1, the output voltage of comparator 46 is inverted to logic "low" level, as indicated by line 96 in FIG. 5D. In response to this, the output voltage level of NAND gate 64 in flip-flop circuit 56 is inverted from logic "low" level to logic "high" level, as indicated by line 98 in FIG. 5. As a result, the output voltage of flip-flop circuit 56 is inverted to logic "low" level, as indicated by line 100 in FIG. 5H. The voltage of logic "low" level is applied to the gate of MOSFE Q, and MOSFET Q is then rendered conductive. As described above, increased external power supply voltage Vcc is directly applied to main circuit section 12 in the semiconductor device. Therefore, the semiconductor device is switched from the normal operation mode to the test mode, and the accelerated test can be performed.

If external power supply voltage Vcc does not exceed potential level V2, the output voltage of NAND gate 2, which serves as the output voltage of flip-flop circuit 56, is kept at logic "high" level. The gate voltage of MOSFET Q is kept at logic "high" level. Therefore, MOSFET Q is rendered nonconductive, and main circuit section 12 in the semiconductor device is normally supplied with internal power supply voltage Vcci having reference level Vr from constant voltage generator 14 serving as the voltage converter.

According to this embodiment, since mode-change controller 20 is arranged in the semiconductor device, the operation mode of the device can be arbitrarily controlled. In the accelerated test mode of the semiconductor-device, when external power supply voltage Vcc is changed, as indicated by lines 28 and 30 of the graph in FIG. 2, mode-change controller 20 automatically detects changes in external power supply voltage Vcc and changes the electrical conditions of switching element 22. In the semiconductor device, voltage generator 14 for generating voltage Vcci is equivalently disconnected from internal main circuit section 12, and at the same time, increased test power supply voltage Vcc is directly applied to main circuit section 12. However, when voltage Vcc applied to the semiconductor device is below a predetermined potential (V2), switching element 22 maintains the initial condition. The device is set in the normal operation mode, and main circuit section 12 is normally applied with internal power supply voltage Vcci regulated by voltage generator 14. Proper low internal power supply voltage Vcci which does not degrade micro-fabricated transistors can be effectively applied to circuit section 12 in the semiconductor device, thereby improving reliability of the highly-integrated semiconductor device. In addition, the operation margin for external power supply voltage Vcc in the normal operation mode of the semiconductor device can be increased. In other words, in the normal operation mode, even if variations in external power supply voltage Vcc are large, low internal power supply voltage Vcci can be stably applied to internal circuit section 12 due to the following reason. The mode change of the semiconductor device is not based on detection with reference to the fixed potential reference higher than external power supply voltage Vcc (conventional technique), but on detection of specific temporal changes in external power supply voltage Vcc.

Although the invention has been described with reference to a specific embodiment, it shall be understood by those skilled in the art that numerous modifications may be made that are within the spirit and scope of the inventive contribution.

For example, in the above embodiment, a switching element is inserted as a mode-change circuit between the external and internal power supply lines independently of a power supply voltage converting circuit, and an ON/OFF control circuit for selecting these power supply lines is arranged. However, if the power supply voltage converting circuit includes a reference voltage generator for setting an internal power supply voltage, an output voltage may be switched by the same control circuit as in FIG. 3. In the above embodiment, the control circuit automatically turns on/off the switching element upon sweeping satisfying predetermined conditions of the external power supply. However, if a terminal for controlling the switching element can be arranged outside the chip, operation mode switching can be performed without using the control circuit in the above embodiment

What is claimed is:

1. A semiconductor, integrated circuit device comprising:
   a semiconductor substrate,
   a main circuit section formed on said semiconductor substrate,
   a constant voltage generator connected to an outside power supply terminal, said constant voltage generator being formed on said semiconductor substrate, said constant voltage generator being able to regulate DC voltage, and said constant voltage generator being connected to said main circuit section; and
   an automatic switching circuit, having two modes of operation, formed on said semiconductor substrate, for providing regulated DC voltage from said constant voltage generator to said main circuit section in one mode of operation, and allowing the voltage from said outside power supply terminal to be directly applied to said main circuit section in the other mode of operation, said automatic switching circuit having means for detecting a time sequential change in the voltage level of said outside power supply terminal which triggers the two modes of operation of said automatic switching circuit.

2. The device according to claim 1, wherein:
   said automatic switching circuit comprises a transistor connected to said constant voltage generator, and
   a control circuit connected to said transistor, for detecting the time sequential changing pattern of said outside power supply terminal, and for automatically switching said transistor.

3. The device according to claim 1, wherein:
   when the voltage of said outside supply terminal applied to said main circuit section changes during a specific time sequence, said automatic switching circuit detects the time sequential change and automatically switches from one mode of operation to the other mode of operation.

4. The device according to claim 3, wherein said automatic switching circuit comprises:
   a switching element connected in parallel with said constant voltage generator, and a control circuit connected to said switching element.

5. The device according to claim 4, wherein:
said control circuit detects that the voltage from said outside power supply terminal increases over a first reference voltage and a second reference voltage which is higher than the first reference voltage and then decreases below the first reference voltage changing the electrical condition of said switching element in such a manner that said constant voltage generator is substantially disconnected from said main circuit section and the voltage of said outside power supply terminal is directly applied to said main circuit section.

6. The device according to claim 5, wherein:
said automatic switching circuit has the same kind of microfabricated transistor as used in said main circuit section.

7. The device according to claim 6, wherein
said automatic switching circuit comprises a metal oxide semiconductor field effect transistor having a gate electrode.

8. The device according to claim 7, wherein said control circuit comprises:
reference voltage generator means for producing first and second output voltages which define the first and second voltages;
comparator means for receiving the first and second output voltages of said reference voltage generator means, and for detecting a mutual relationship of the voltage of said outside power supply terminal with respect to the first and second reference voltages; and
a flip-flop circuit connected to said comparator means and the gate electrode of said transistor.

* * * * *